(12) United States Patent
Trasporto et al.

(10) Patent No.: US 8,269,324 B2
(45) Date of Patent: Sep. 18, 2012

(54) INTEGRATED CIRCUIT PACKAGE SYSTEM WITH CHIP ON LEAD

(75) Inventors: Arnel Senosa Trasporto, Singapore (SG); Zigmund Ramirez Camacho, Singapore (SG); Lionel Chien Hui Tay, Singapore (SG); Jose Alvin Caparas, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 425 days.

(21) Appl. No.: 12/172,095

(22) Filed: Jul. 11, 2008

(65) Prior Publication Data
US 2010/0006993 A1    Jan. 14, 2010

(51) Int. Cl.
H01L 23/495 (2006.01)
H01L 21/60 (2006.01)

(52) U.S. Cl. ........ 257/676; 257/690; 257/692; 257/784; 257/E23.032; 257/E23.037; 257/E23.039; 438/111

(58) Field of Classification Search .................. 257/676, 257/690, 692, 784, E23.032, E23.037, E23.039; 438/111, 11
See application file for complete search history.

(56) References Cited

U.S. PATENT DOCUMENTS

| | | | |
|---|---|---|---|
| 4,937,656 A | 6/1990 | Kohara | |
| 5,373,188 A | 12/1994 | Michii et al. | |
| 6,075,284 A * | 6/2000 | Choi et al. | 257/676 |
| 6,084,310 A * | 7/2000 | Mizuno et al. | 257/779 |
| 6,268,652 B1* | 7/2001 | Kimura | 257/696 |
| 6,297,543 B1* | 10/2001 | Hong et al. | 257/666 |
| 6,927,483 B1 | 8/2005 | Lee et al. | |
| 6,943,061 B1* | 9/2005 | Sirinorakul et al. | 438/113 |
| 7,161,232 B1 | 1/2007 | Lee et al. | |
| 7,217,991 B1* | 5/2007 | Davis | 257/676 |
| 7,253,508 B2* | 8/2007 | Liu et al. | 257/678 |
| 7,307,347 B2* | 12/2007 | Yagi | 257/773 |
| 7,352,055 B2* | 4/2008 | Shim et al. | 257/673 |
| 2002/0079592 A1* | 6/2002 | Lo et al. | 257/778 |
| 2007/0161157 A1* | 7/2007 | Islam et al. | 438/120 |
| 2007/0252247 A1* | 11/2007 | Kim et al. | 257/666 |
| 2009/0026590 A1* | 1/2009 | Lim et al. | 257/670 |

* cited by examiner

*Primary Examiner* — Peniel M Gumedzoe
(74) *Attorney, Agent, or Firm* — Ishimaru & Associates LLP; Mikio Ishimaru; Stanley M. Chang

(57) ABSTRACT

An integrated circuit package system includes: providing a lead having a lead connection surface for connectivity to a next level system; attaching an integrated circuit over the lead having the lead connection surface substantially within a region below a perimeter of the integrated circuit without a die paddle, a substrate conductor, or a redistribution layer; and attaching a die connector to the integrated circuit and the lead.

20 Claims, 14 Drawing Sheets

INTEGRATED CIRCUIT PACKAGE SYSTEM WITH CHIP ON LEAD

TECHNICAL FIELD

The present invention relates generally to integrated circuit package systems and more particularly to a system for integrated circuit packages with chip on lead.

BACKGROUND ART

Electronics are an integral part of modern life as they are included in personal portable devices such as cellular phones, digital cameras, and music players as well as computers, automobiles, and manufacturing systems. The market for electronic devices or products demand increasing functions and decreasing costs to provide higher performance is smaller sizes.

The electronic industry continues to seek products that are lighter, faster, smaller, multi-functional, highly reliable, and lower in cost. In efforts to meet such requirements, improvements have been attempted in all aspects of electronic development.

Demands for smaller, higher performance integrated circuit devices have motivated development of new techniques for producing smaller and less expensive semiconductor chips. Unfortunately, this development is still not enough to satisfy the demands. Other efforts involve packaging the integrated circuit chip in as small a form factor as possible.

Integrated circuit packaging technology has been driven towards increasing the circuit density on a printed circuit board (PCB) or substrate including the reduction in the number of components needed for a product. The resulting packaging designs are more compact in the physical size, shape, and significantly increase overall circuit density. However, circuit density continues to be limited by the area available for mounting chips.

To condense the packaging of individual chips, packages have been developed in which more than one chip can be packaged at one time for each package site. Each package site is a structure that provides mechanical support for the individual integrated circuit chips. It also provides one or more layers of interconnect lines that enable the chips to be connected electrically to surrounding circuitry.

Attempts to provide multi chip packages have been plagued with manufacturing problems. One problem is special mold processes such as top center gate or side mold gate that can cause warpage and limit package sizes or heights. Another problem is additional substrate treatments for connectors to the substrate. These and other manufacturing problems increase complexity and cost reducing usable packages and rising prices.

Despite the advantages of recent developments in semiconductor fabrication and packaging techniques, there is a continuing need for improving packaging methods, systems, and designs.

Thus, a need still remains for an integrated circuit package system with improved cost, reliability particularly for low pin count, high-density mini QFN devices.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention includes: providing a lead having a lead connection surface for connectivity to a next level system; attaching an integrated circuit over the lead having the lead connection surface substantially within a region below a perimeter of the integrated circuit without the need for a die paddle, a substrate conductor, or a redistribution layer; and attaching a die connector to the integrated circuit and the lead.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
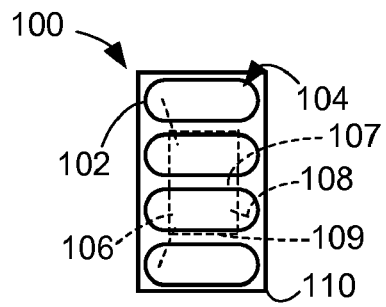
FIG. 1 is a bottom plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "upward", "downward", "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a bottom plan view of an integrated circuit package system 100 in a first embodiment of the present invention. The integrated circuit package system 100 preferably includes leads 102 having a lead connection surface 104, an integrated circuit 106, a region 107 below a perimeter 109 of the integrated circuit 106, and die connectors 108. Dotted lines are used to show features normally not visible from the bottom plan view.

The integrated circuit 106 can be attached or mounted over the leads 102. The leads 102 can provide die support in a manner similar to a die attach pad without the need for die attach pads. The leads 102 can all be the same size and all parallel to each other. A portion of the leads 102 can include the lead connection surface 104 substantially within the region 107 below the perimeter 109 of the integrated circuit 106.

A portion of the leads 102 as well as the lead connection surface 104 can be substantially within the region 107 below the perimeter 109 of the integrated circuit 106 without the need for a perimeter lead, a substrate conductor, or a redistribution layer for electrical connectivity.

The lead connection surface 104 can be substantially exposed on a side of the leads 102 opposite the integrated circuit 106 for connectivity to a next level system such as another package or a printed circuit board.

Attaching or mounting the integrated circuit 106 over the leads 102 such as a chip on lead configuration significantly improves numbers of leads as well as spacing between the leads 102 without the need for a die paddle, a perimeter lead, a substrate conductor, or a redistribution layer. The die connectors 108 can electrically connect the integrated circuit 106 and the leads 102 including the leads 102 substantially under the integrated circuit 106.

The leads 102 can form a quad flat nolead (QFN) package having the lead connection surface 104 substantially within extents of an encapsulant 110. Improved spacing and areal density of the leads 102 provides improved parasitics such as resistance, inductance, and capacitance (RLC) particularly for low pin count, high-density mini QFN devices.

The encapsulant 110 can cover or protect the leads 102, the integrated circuit 106, or the die connectors 108. Electrical isolation from the encapsulant 110 can provide discrete electrical connectivity for each of the leads 102.

It has been unexpectedly discovered that the present invention having the lead connection surface 104 of a portion of the leads 102 substantially within the region 107 below the perimeter 109 of the integrated circuit 106 provides a wide variety of lead counts and improved performance particularly for low pin count, high-density devices resulting in improved cost and reliability.

Figure 2:
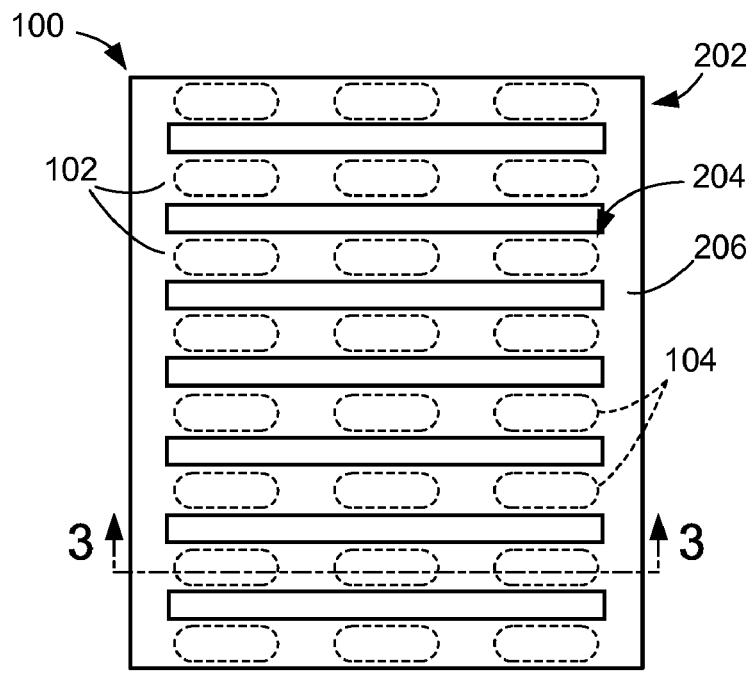
FIG. 2 is a top plan view of the integrated circuit package system in a formation phase.

Referring now to FIG. 2, therein is shown a top plan view of the integrated circuit package system 100 in a formation phase. The integrated circuit package system 100 preferably includes a leadframe 202 including an array of the leads 102 having a lead mounting surface 204 on a side opposite the lead connection surface 104.

Devices, connectors, or other components can be mounted over or attached to the lead mounting surface 204. For example, the lead mounting surface 204 can be substantially covered by devices, connectors, or other components resulting in significantly reduced regions for electrical connections.

A dambar 206 can provide structural integrity and substantially fixed positions for the leads 102 during processing. The dambar 206 can be removed by removal processes such as sawing or etching. A portion of the dambar 206 can optionally be connected to the leads 102 as resulting from some of the removal processes.

For illustrative purposes, the leadframe 202 is shown having three columns of the leads 102 or the lead connection surface 104 although it is understood that any number or configuration of the leads 102 or the lead connection surface 104 may be used.

Figure 3:
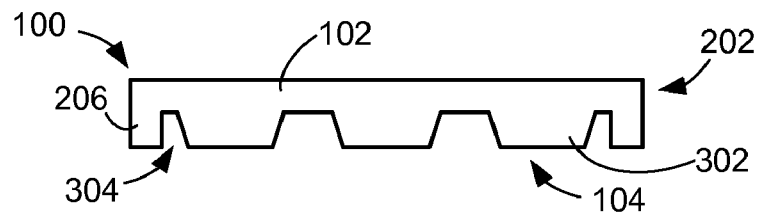
FIG. 3 is a cross-sectional view of the structure of FIG. 2.

Referring now to FIG. 3, therein is shown a cross-sectional view of the structure of FIG. 2. The integrated circuit package system 100 preferably includes the leadframe 202 having the leads 102 and the dambar 206.

The leads 102 can optionally include a lead protrusion 302 or a lead recess 304 preferably near the lead connection surface 104. The lead recess 304 can optionally be formed in the leads 102 or the dambar 206 providing partial isolation or separation for more than one of the lead connection surface 104.

The lead protrusion 302 can also provide partial isolation or separation for adjacent instances of the lead connection surface 104. The lead protrusion 302 can also provide improve connectivity to a next level system.

Figure 4:
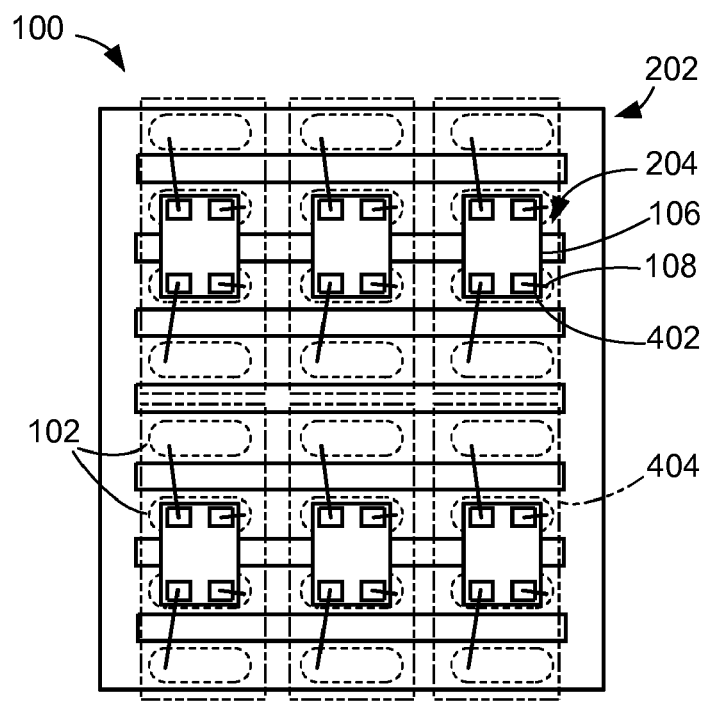
FIG. 4 is the structure of FIG. 2 in an attach phase.

Referring now to FIG. 4, therein is shown the structure of FIG. 2 in an attach phase. The integrated circuit package system 100 preferably includes the leadframe 202 with one or more of the integrated circuit 106 thereover. Die pads 402 of the integrated circuit 106 can be electrically connected to the lead mounting surface 204 of the leads 102 by the die connectors 108.

For illustrative purposes, an array of the integrated circuit 106 is shown over the leadframe 202 and can separated, isolated, or singulated near phantom lines for package outlines 404 to provide individual packages for each of the integrated circuit 106 although it is understood that any number of the integrated circuit 106 may be included in a package.

Figure 5:
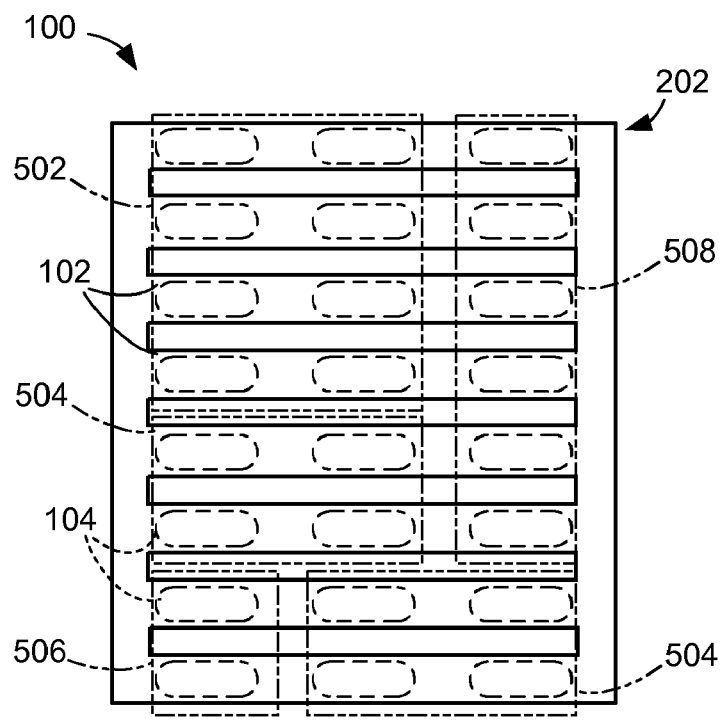
FIG. 5 is the structure of FIG. 2 in a preparation phase.

Referring now to FIG. 5, therein is shown the structure of FIG. 2 in a preparation phase. The integrated circuit package system 100 preferably includes the leadframe 202 with an array of the leads 102 having the lead connection surface 104.

Phantom lines are shown to depict optional packages having an array of the leads 102 such as the package outlines 404 of FIG. 4. A first package extent 502 can include a two by four array, a second package extent 504 can include a two by two array, a third package extent 506 can include a one by two array, and a fourth package extent 508 can include a one by six array of the leads 102.

Removal processes can be applied near the phantom line to singulate the optional individual packages. For illustrative purposes, the leadframe 202 is shown having different leadcount configurations although it is understood that one of the leadframe 202 may contain any number of leadcount configuration. Typically, one leadcount configuration would be provided per leadframe for manufacturing efficiency.

Figure 6:
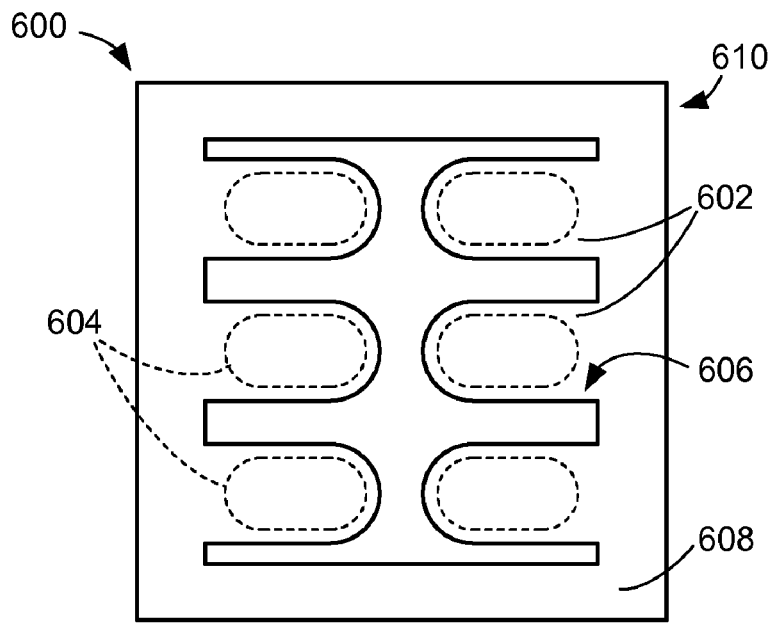
FIG. 6 is a top view of an integrated circuit package system in a formation phase of a second embodiment of the present invention.

Referring now to FIG. 6, therein is shown a top view of an integrated circuit package system 600 in a formation phase of a second embodiment of the present invention. The integrated circuit package system 600 preferably includes leads 602 having a lead connection surface 604 on a side opposite a lead mounting surface 606.

Devices, connectors, or other components can be mounted over or attached to the lead mounting surface 606. For example, the lead mounting surface 606 can be substantially covered by devices, connectors, or other components resulting in significantly reduced regions for electrical connections.

The leads 602 can be formed as separate structures connected by a dambar 608 around a perimeter or at outer extents of the leads 602. For example, a leadframe 610 can be formed having spacing around sides of the leads 602 except at an outer edge connected to the dambar 608 resulting in improved removal for singulation.

The dambar 608 can provide structural integrity and substantially fixed positions for the leads 602 during processing. The dambar 608 can be removed by removal processes such as sawing or etching. A portion of the dambar 608 can optionally be connected to the leads 602 resulting from some removal processes.

Figure 7:
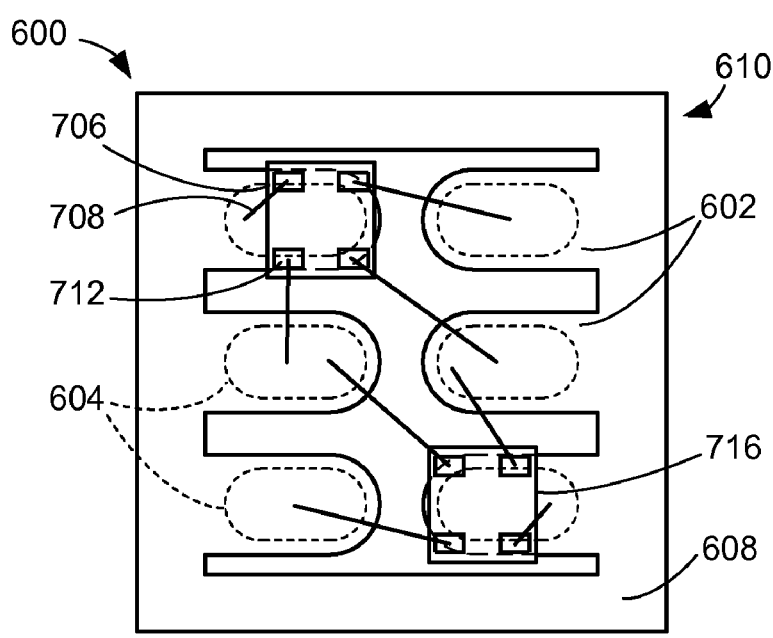
FIG. 7 is the structure of FIG. 6 in an attach phase.

Referring now to FIG. 7, therein is shown the structure of FIG. 6 in an attach phase. The integrated circuit package system 600 preferably includes the leads 602 with a first integrated circuit 706 thereover without the need for a die paddle, a perimeter lead, a substrate conductor, or a redistribution layer. Die connectors 708 can electrically connect die pads 712 of the first integrated circuit 706 and the leads 602 of the leadframe 610.

The die connectors 708 can connect the first integrated circuit 706 to the leads 602 having the lead connection surface 604 substantially within a region below a perimeter of the first integrated circuit 706 as well as adjacent locations of the leads 602. Further, more than one of the first integrated circuit 706 can be connected to any of the leads 602.

Optionally one of the leads 602 as well as the lead connection surface 604 can be substantially within the region below the perimeter of the first integrated circuit 706 or a second integrated circuit 716. The lead connection surface 604 can be substantially exposed on a side of the leads 602 opposite the first integrated circuit 706 or the second integrated circuit 716 for connectivity to a next level system such as another package or a printed circuit board.

For illustrative purposes the integrated circuit package system 600 is shown with the first integrated circuit 706 and the second integrated circuit 716 attached or mounted over one and another of the leads 602 although it is understood than any number of integrated circuit die such as the first integrated circuit 706 or the second integrated circuit 716 may be used.

Figure 8:
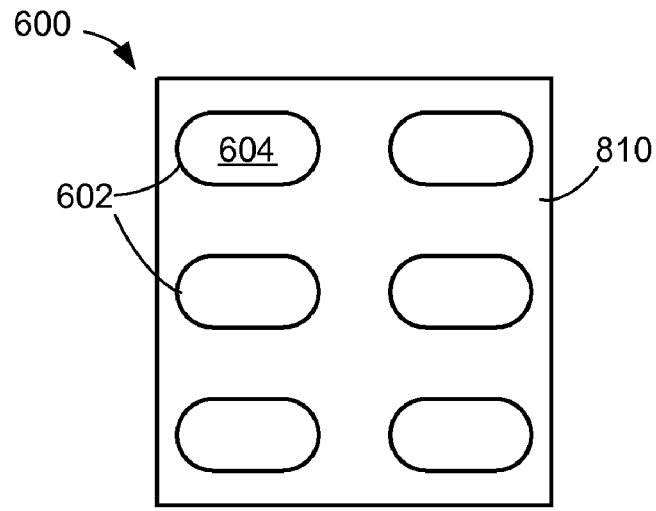
FIG. 8 is a bottom view of the integrated circuit package system.

Referring now to FIG. 8, therein is shown a bottom view of the integrated circuit package system 600. The integrated circuit package system 600 preferably includes the leads 602 having the lead connection surface 604 and an encapsulant 810.

The encapsulant 810 can cover or protect the leads 602, the first integrated circuit 706 of FIG. 7, the second integrated circuit 716 of FIG. 7, or the die connectors 708 of FIG. 7. Electrical isolation from the encapsulant 810 can provide discrete electrical connectivity for each of the leads 602.

Figure 9:
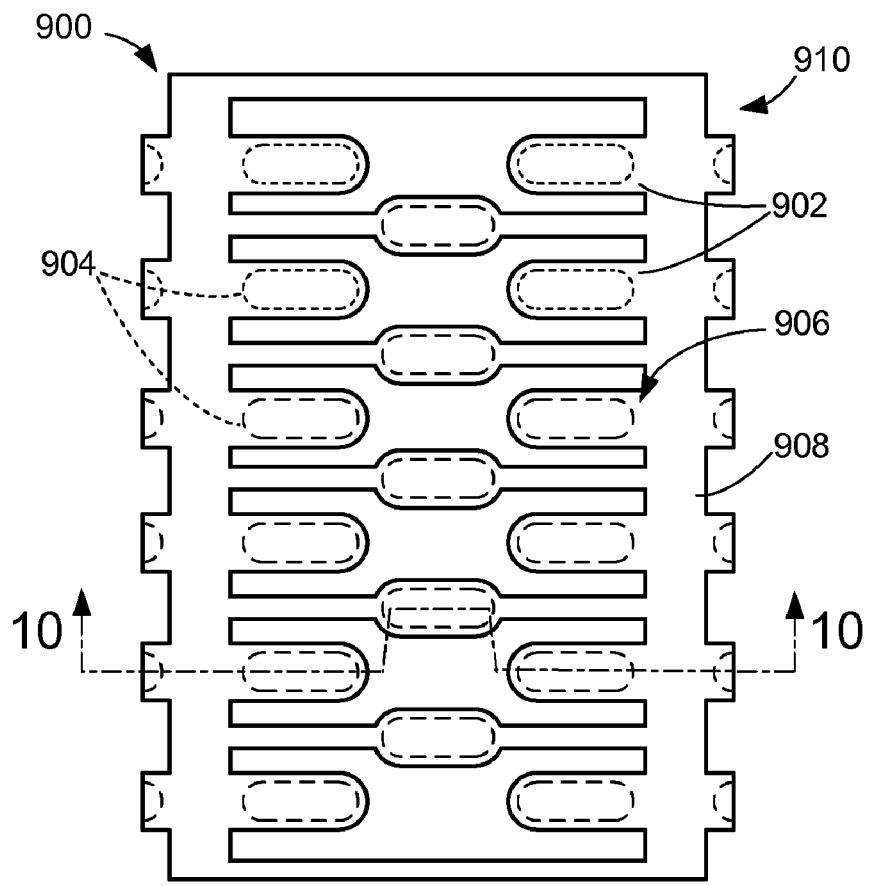
FIG. 9 is a top view of an integrated circuit package system in a formation phase of a third embodiment of the present invention.

Referring now to FIG. 9, therein is shown a top view of an integrated circuit package system 900 in a formation phase of a third embodiment of the present invention. The integrated circuit package system 900 preferably includes leads 902 having a lead connection surface 904 on a side opposite a lead mounting surface 906.

Devices, connectors, or other components can be mounted over or attached to the lead mounting surface 906. For example, the lead mounting surface 906 can be substantially covered by devices, connectors, or other components resulting in significantly reduced regions for electrical connections.

The leads 902 can be formed as separate rows connected by a dambar 908 around a perimeter or at outer extents of the leads 902. For example, a portion of the leads 902 can form two columns disposed at opposite edges of a leadframe 910 and another portion of the leads 902 can be connected to opposite edges of the leadframe 910 and have the lead connection surface 904 near a centerline.

The dambar 908 can provide structural integrity and substantially fixed positions for the leads 902 during processing. The dambar 908 can be removed by removal processes such as sawing or etching. A portion of the dambar 908 can optionally be connected to the leads 902 resulting from some removal processes.

Figure 10:
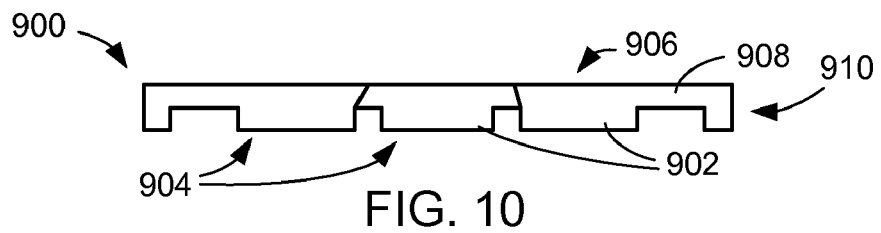
FIG. 10 is a cross-sectional view of the structure of FIG. 9 taken along line 10-10 of FIG. 9.

Referring now to FIG. 10, therein is shown a cross-sectional view of the structure of FIG. 9 taken along line 10-10 of FIG. 9. The integrated circuit package system 900 preferably includes the leadframe 910 with the leads 902 and the dambar 908. The leads 902 include the lead connection surface 904 on a side opposite the lead mounting surface 906.

Three of the leads 902 including the lead connection surface 904 are shown in cross-section. For example, a portion of the leads 902 can be formed at opposite edges of the leadframe 910 and another portion of the leads 902 can be connected across the leadframe 910 having the lead connection surface 904 near a centerline.

Figure 11:
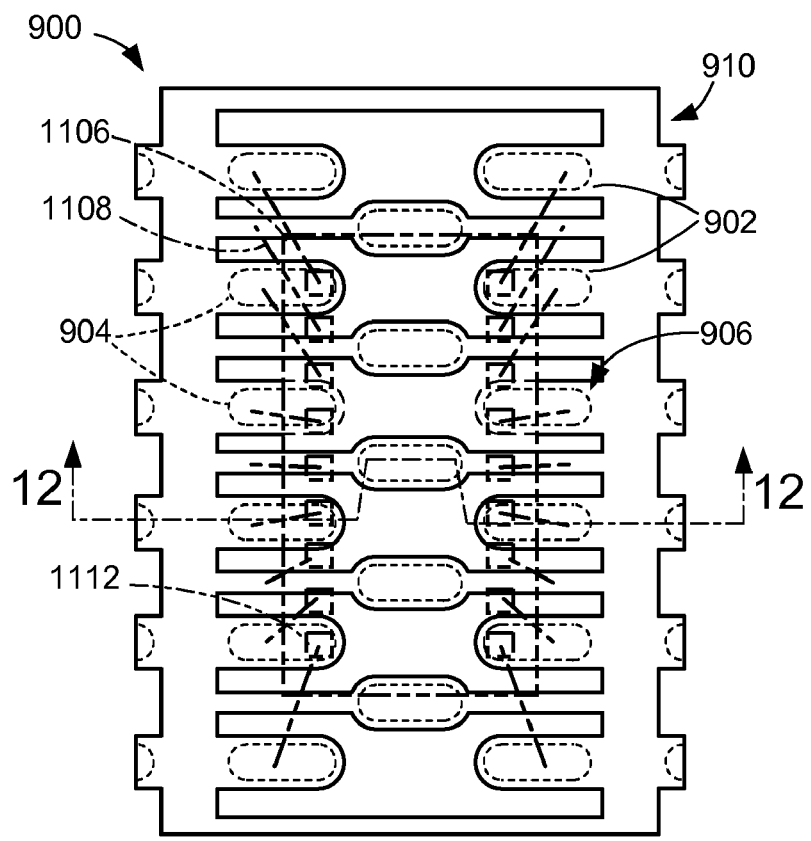
FIG. 11 is the structure of FIG. 9 in an attach phase.

Referring now to FIG. 11, therein is shown the structure of FIG. 9 in an attach phase. The integrated circuit package system 900 preferably includes the leads 902 with an integrated circuit 1106 thereover. Die connectors 1108 can electrically connect die pads 1112 of the integrated circuit 1106 and the leads 902 of the leadframe 910.

The die connectors 1108 can connect the integrated circuit 1106 to the leads 902 having the lead connection surface 904 substantially within a region below a perimeter of the integrated circuit 1106 as well as adjacent locations of the leads 902 without the need for a die paddle, a perimeter lead, a substrate conductor, or a redistribution layer.

The integrated circuit 1106 can be attached or mounted over the leads 902. The leads 902 can provide die support in a manner similar to a die attach pad without the need for die attach pads. A portion of the leads 902 can include the lead connection surface 904 substantially within the region below the perimeter of the integrated circuit 1106.

The lead connection surface 904 can be substantially exposed on a side of the leads 902 opposite the integrated circuit 1106 for connectivity to a next level system such as another package or a printed circuit board.

Figure 12:
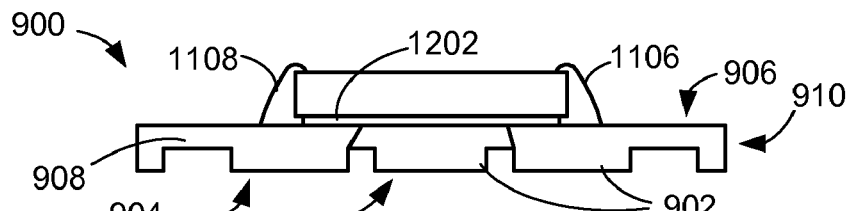
FIG. 12 is a cross-sectional view of the structure of FIG. 11 taken along line 12-12 of FIG. 1.

Referring now to FIG. 12, therein is shown a cross-sectional view of the structure of FIG. 11 taken along line 12-12 of FIG. 11. The integrated circuit package system 900 preferably includes the leadframe 910 with the leads 902 and the dambar 908. The leads 902 include the lead connection surface 904 on a side opposite the lead mounting surface 906.

The integrated circuit 1106 can be attached or mounted over the lead mounting surface 906 of the leads 902 without the need for a die paddle, a perimeter lead, a substrate conductor, or a redistribution layer. An attach layer 1202 such as a die attach adhesive for wafer backside coating (WBC) or wafer backside laminate (WBL) can be applied for attaching or mounting the integrated circuit 1106 over the leads 902.

The attach layer 1202 can optionally be formed as a wafer backside coating provides an adhesive such as a B-stageable product that can be stenciled or screen-printed. Another option can include the attach layer 1202 formed as a wafer backside laminate provides an adhesive laminate or layer.

Figure 13:
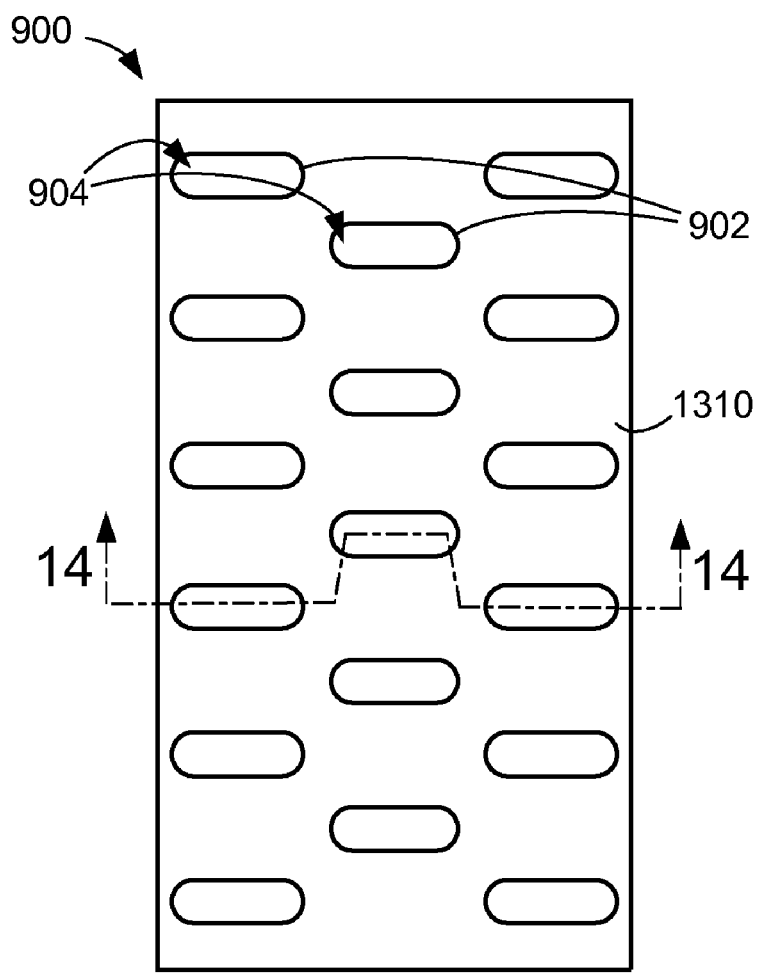
FIG. 13 is a bottom view of the integrated circuit package system.

Referring now to FIG. 13, therein is shown a bottom view of the integrated circuit package system 900. The integrated circuit package system 900 preferably includes the leads 902 having the lead connection surface 904 and an encapsulant 1310.

The encapsulant 1310 can cover or protect the leads 902, the integrated circuit 1106 of FIG. 11, or the die connectors 1108 of FIG. 11. Electrical isolation from the encapsulant 1310 can provide discrete electrical connectivity for each of the leads 902.

For illustrative purposes, an array of the lead connection surface 904 is shown having an inner column staggered from two outer columns although it is understood than any number or configurations of the leads 902 or the lead connection surface 904 may be used.

Figure 14:
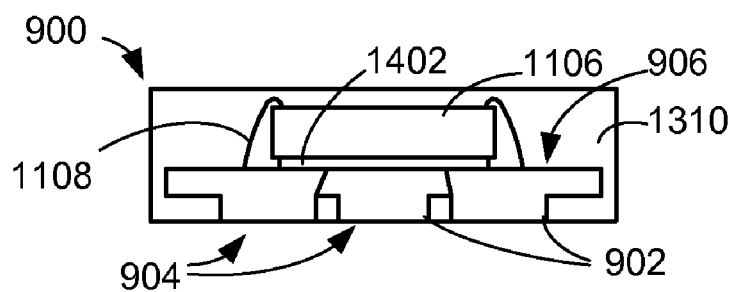
FIG. 14 is a cross-sectional view of the structure of FIG. 13 taken along line 14-14 of FIG. 13.

Referring now to FIG. 14, therein is shown a cross-sectional view of the structure of FIG. 13 taken along line 14-14 of FIG. 13. The integrated circuit package system 900 preferably includes the die connectors 1108, the integrated circuit 1106, and the leads 902.

The integrated circuit 1106 can be attached or mounted over the lead mounting surface 906 of the leads 902. An attach layer 1402 can attach or mount the integrated circuit 1106 over the leads 902 providing structural integrity or a substantially fixed location.

The encapsulant 1310 can cover or protect the die connectors 1108, the integrated circuit 1106, and a portion of the leads 902 providing the lead connection surface 904 substantially exposed or connectivity to a next level system.

Figure 15:
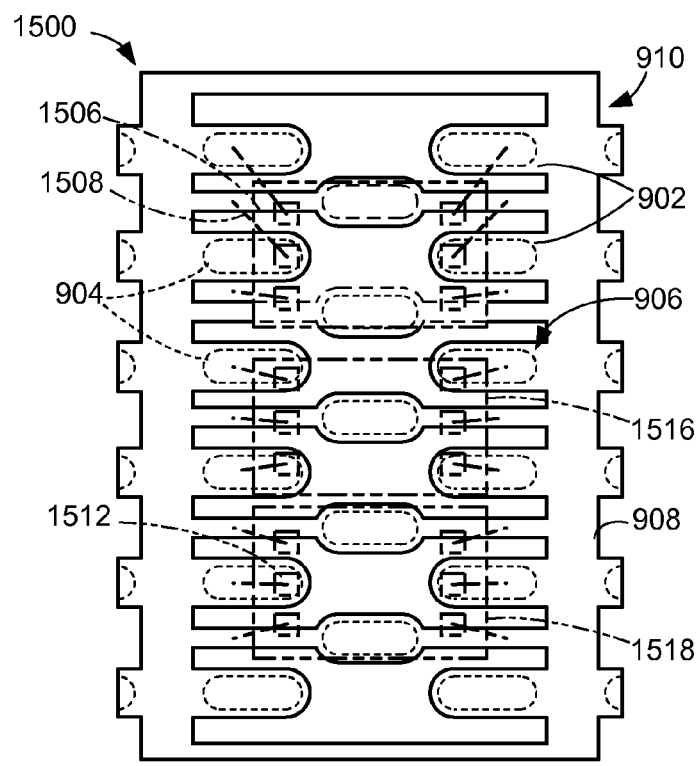
FIG. 15 is a top view of an integrated circuit package system in an attach phase of a fourth embodiment of the present invention.

Referring now to FIG. 15, therein is shown a top view of an integrated circuit package system 1500 in an attach phase of a fourth embodiment of the present invention. The integrated circuit package system 1500 preferably includes the leads 902 with a first integrated circuit 1506 having die pads 1512 thereover.

The first integrated circuit 1506 can be attached or mounted over the leads 902. The leads 902 can provide die support in a manner similar to a die attach pad without the need for die attach pads. A portion of the leads 902 can include the lead connection surface 904 substantially within a region below a perimeter of the first integrated circuit 1506.

The lead connection surface 904 can be substantially exposed on a side of the leads 902 opposite the first integrated circuit 1506 for connectivity to a next level system such as another package or a printed circuit board.

For example, the first integrated circuit 1506, a second integrated circuit 1516, or a third integrated circuit 1518 can be placed over the leadframe 910. Each of the first integrated circuit 1506, the second integrated circuit 1516, or the third integrated circuit 1518 can be attached or mounted over the leads 902 having the lead connection surface 904 near a centerline and can include the die pads 1512 adjacent the leads 902.

Die connectors 1508 can electrically connect the die pads 1512 and the leads 902. The die connectors 1508 can connect the first integrated circuit 1506, the second integrated circuit 1516, or the third integrated circuit 1518 to the leads 902 having the lead connection surface 904 substantially within the region below the perimeter of the first integrated circuit 1506, the second integrated circuit 1516, or the third integrated circuit 1518 as well as adjacent locations of the leads 902.

Figure 16:
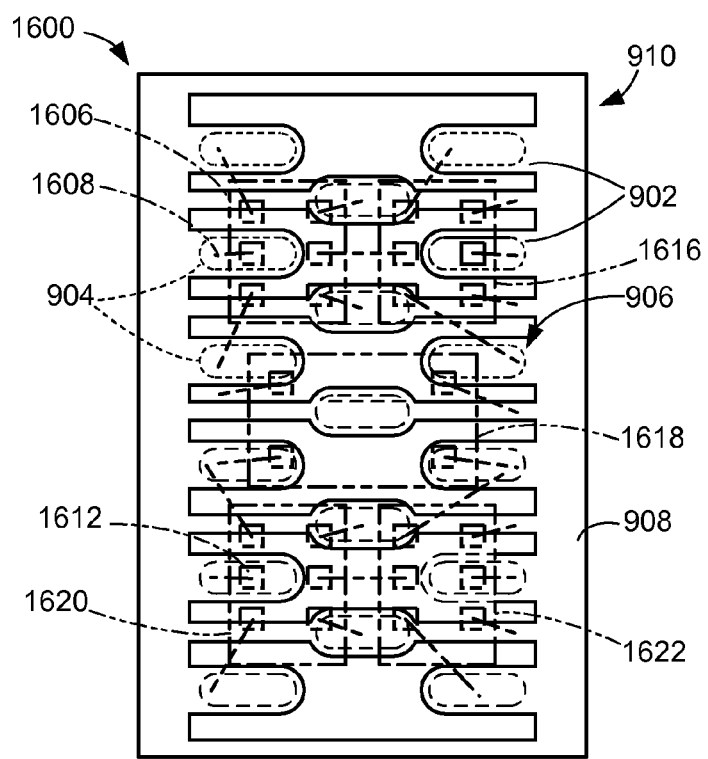
FIG. 16 is a top view of an integrated circuit package system in an attach phase of a fifth embodiment of the present invention.

Referring now to FIG. 16, therein is shown a top view of an integrated circuit package system 1600 in an attach phase of a fifth embodiment of the present invention. The integrated circuit package system 1600 preferably includes the leads 902 with a first integrated circuit 1606 having die pads 1612 thereover.

The first integrated circuit 1606 can be attached or mounted over the leads 902 without the need for a die paddle, a perimeter lead, a substrate conductor, or a redistribution layer. The leads 902 can provide die support in a manner similar to a die attach pad without the need for die attach pads. A portion of the leads 902 can include the lead connection surface 904 substantially within a region below a perimeter of the first integrated circuit 1606.

The lead connection surface 904 can be substantially exposed on a side of the leads 902 opposite the first integrated circuit 1606 for connectivity to a next level system such as another package or a printed circuit board.

For example, the first integrated circuit 1606, a second integrated circuit 1616, a third integrated circuit 1618, a fourth integrated circuit 1620, or a fifth integrated circuit 1622 can be placed over the leadframe 910 and attached or mounted over the leads 902 in a two-one-two pattern. The "one pattern" can be over a centerline and the "two pattern" can be substantially parallel on either side of the centerline.

The integrated circuits can include the die pads 1612 aligned substantially parallel to the centerline columns and adjacent the leads 902. The "one pattern" can include the die pads 1612 adjacent the leads 902 disposed at opposite edges of the leadframe 910. The "two pattern" can include the die pads 1612 adjacent the leads 902 near the centerline.

Die connectors 1608 can electrically connect the die pads 1612 and the leads 902. The die connectors 1608 can connect the first integrated circuit 1606 to the leads 902 having the lead connection surface 904 substantially within the region below the perimeter of the first integrated circuit 1606 as well as adjacent locations of the leads 902.

Figure 17:
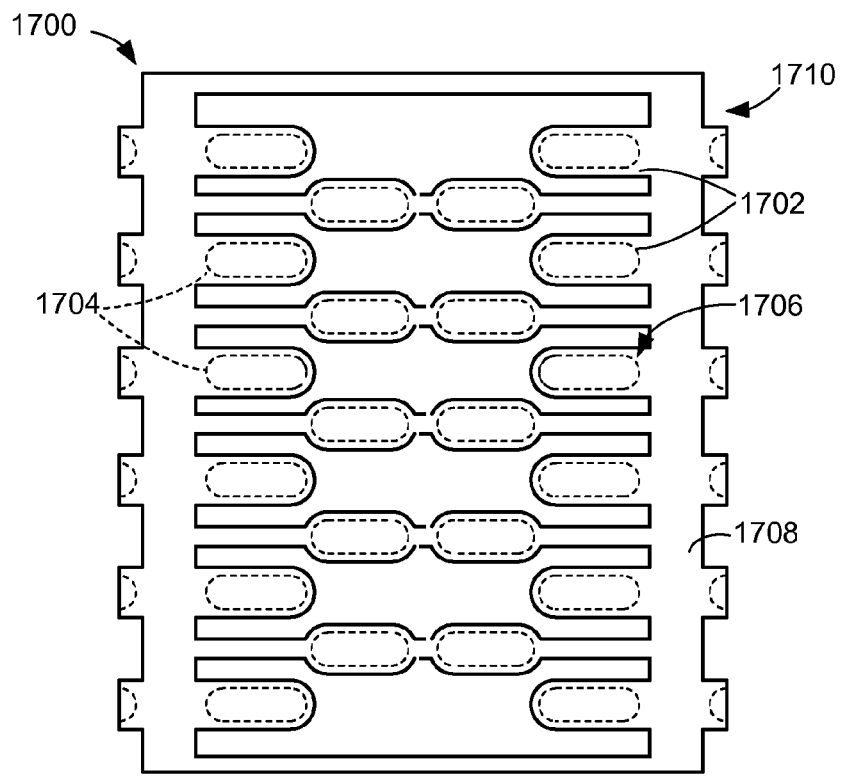
FIG. 17 is a top view of an integrated circuit package system in a formation phase of a sixth embodiment of the present invention.

Referring now to FIG. 17, therein is shown a top view of an integrated circuit package system 1700 in a formation phase of a sixth embodiment of the present invention. The integrated circuit package system 1700 preferably includes leads 1702 having a lead connection surface 1704 on a side opposite a lead mounting surface 1706.

Devices, connectors, or other components can be mounted over or attached to the lead mounting surface 1706. For example, the lead mounting surface 1706 can be substantially covered by devices, connectors, or other components resulting in significantly reduced regions for electrical connections.

The leads 1702 can be formed as separate rows connected by a dambar 1708 around a perimeter or at outer extents of the leads 1702. For example, a portion of the leads 1702 can form two columns disposed at opposite edges of a leadframe 1710 and another portion of the leads 1702 can be connected to opposite edges of the leadframe 1710 and have two of the lead connection surface 1704 near a centerline.

The dambar 1708 can provide structural integrity and substantially fixed positions for the leads 1702 during processing. The dambar 1708 can be removed by removal processes such as sawing or etching. A portion of the dambar 1708 can optionally be connected to the leads 1702 resulting from some removal processes.

Figure 18:
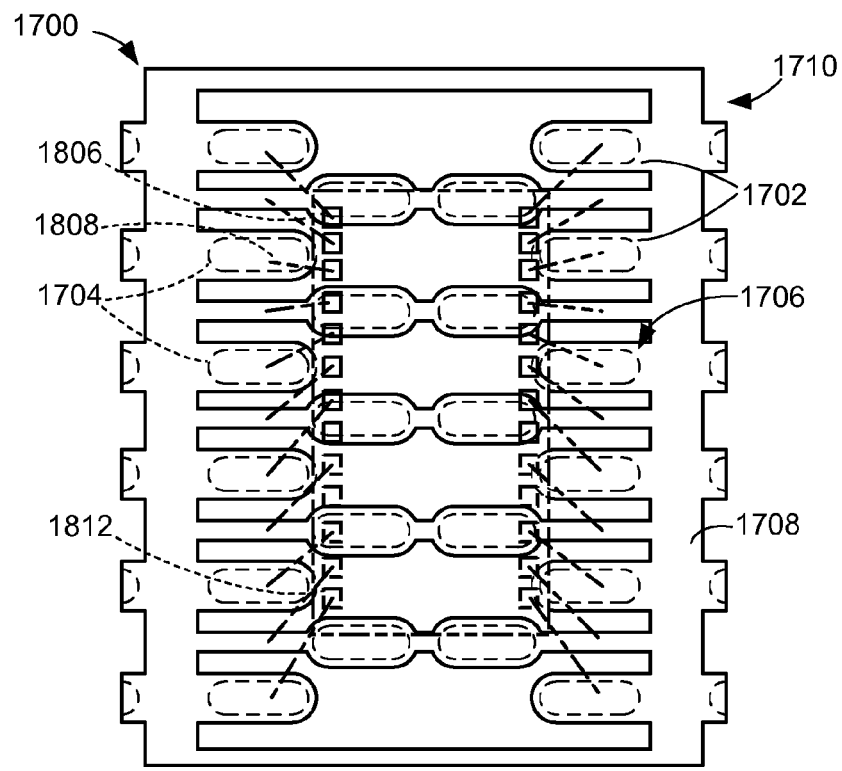
FIG. 18 is a top view of the structure of FIG. 17 in an attach phase.

Referring now to FIG. 18, therein is shown a top view of the structure of FIG. 17 in an attach phase. The integrated circuit package system 1700 preferably includes the leads 1702 with an integrated circuit 1806 thereover. Die connectors 1808 can electrically connect die pads 1812 of the integrated circuit 1806 and the leads 1702 of the leadframe 1710.

The die connectors 1808 can connect the integrated circuit 1806 to the leads 1702 having the lead connection surface 1704 substantially within a region below a perimeter of the integrated circuit 1806 as well as adjacent locations of the leads 1702.

The lead connection surface 1704 can be substantially exposed on a side of the leads 1702 opposite the integrated circuit 1806 for connectivity to a next level system such as another package or a printed circuit board.

The integrated circuit 1806 can be attached or mounted over the leads 1702 without the need for a die paddle, a perimeter lead, a substrate conductor, or a redistribution layer. The leads 1702 can provide die support in a manner similar to a die attach pad without the need for die attach pads. A portion of the leads 1702 can include the lead connection surface 1704 substantially within the region below the perimeter of the integrated circuit 1806.

Figure 19:
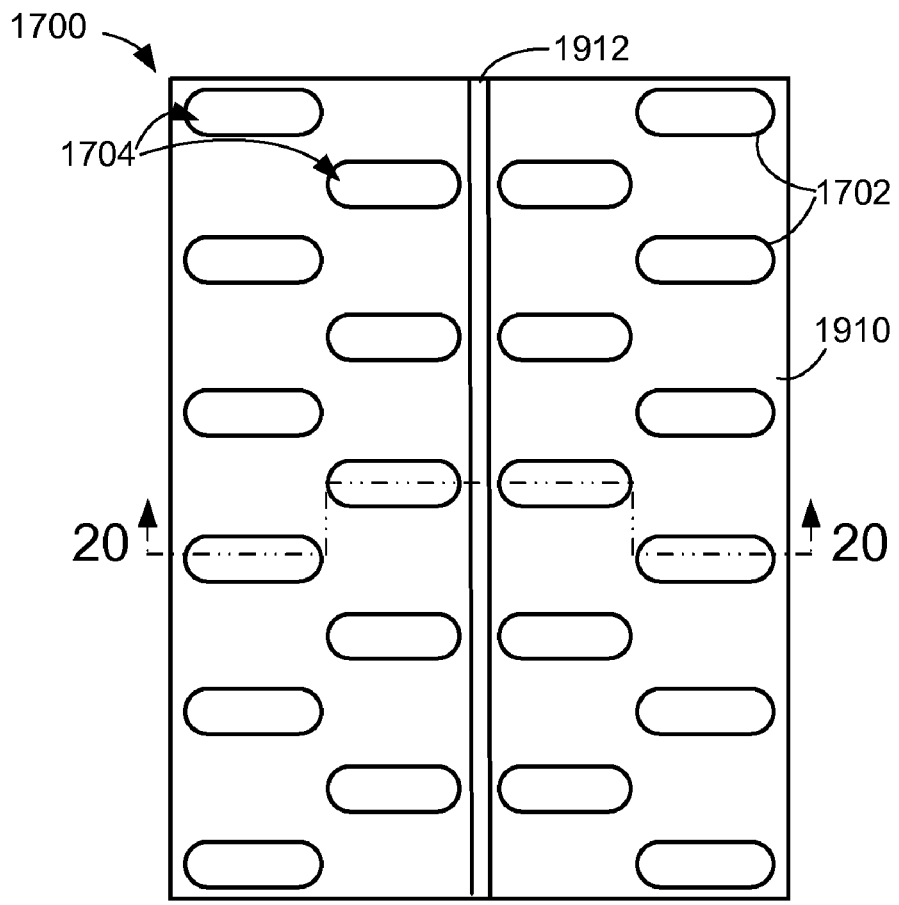
FIG. 19 is a bottom view of the integrated circuit package system.

Referring now to FIG. 19, therein is shown a bottom view of the integrated circuit package system 1700. The integrated circuit package system 1700 can preferably include the leads 1702 having the lead connection surface 1704 and an encapsulant 1910.

The encapsulant 1910 can cover or protect the leads 1702, the integrated circuit 1806 of FIG. 18, or the die connectors 1808 of FIG. 18. Electrical isolation from the encapsulant 1910 can provide discrete electrical connectivity for each of the leads 1702.

An isolation channel 1912 can be formed in the encapsulant 1910 and the leads 1702 by processing such as partial saw cut or other removal process. The isolation channel 1912 can provide electrical isolation of the two center columns of the lead connection surface 1704 substantially within the region below the perimeter of the integrated circuit 1806 of FIG. 18.

For illustrative purposes, an array of the lead connection surface 1704 is shown having two inner columns staggered from two outer columns although it is understood than any number or configuration of the leads 1702 or the lead connection surface 1704 may be used.

Figure 20:
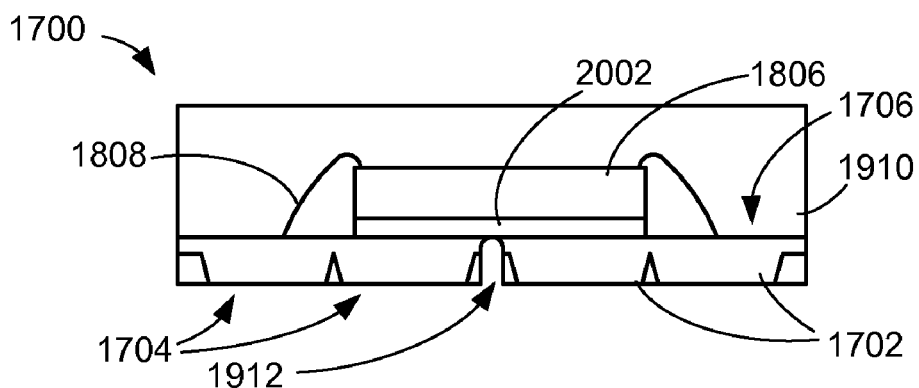
FIG. 20 is a cross-sectional view of the structure of FIG. 19 taken along line 20-20 of FIG. 19.

Referring now to FIG. 20, therein is shown a cross-sectional view of the structure of FIG. 19 taken along line 20-20 of FIG. 19. The integrated circuit package system 1700 preferably includes the die connectors 1808, the integrated circuit 1806, and the leads 1702.

The integrated circuit 1806 can be attached or mounted over the lead mounting surface 1706 of the leads 1702 without the need for a die paddle, a perimeter lead, a substrate conductor, or a redistribution layer. An attach layer 2002 can attach or mount the integrated circuit 1806 over the leads 1702 providing structural integrity or a substantially fixed location.

The encapsulant 1910 can cover or protect the die connectors 1808, the integrated circuit 1806, and a portion of the leads 1702 providing the lead connection surface 1704 substantially exposed or connectivity to a next level system.

The isolation channel 1912 can provide electrical isolation of the two center columns of the leads 1702 having the lead connection surface 1704 substantially within the region below the perimeter of the integrated circuit 1806.

The lead connection surface 1704 can be substantially exposed on a side of the leads 1702 opposite the integrated circuit 1806 for connectivity to a next level system such as another package or a printed circuit board.

Figure 21:
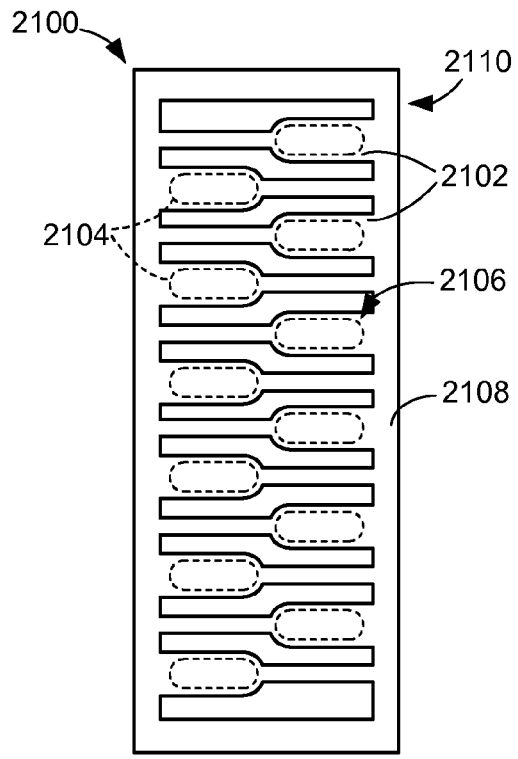
FIG. 21 is a top view of an integrated circuit package system in a formation phase of a seventh embodiment of the present invention.

Referring now to FIG. 21, therein is shown a top view of an integrated circuit package system 2100 in a formation phase of a seventh embodiment of the present invention. The integrated circuit package system 2100 preferably includes leads 2102 having a lead connection surface 2104 on a side opposite a lead mounting surface 2106.

Devices, connectors, or other components can be mounted over or attached to the lead mounting surface 2106. For example, the lead mounting surface 2106 can be substantially covered by devices, connectors, or other components resulting in significantly reduced regions for electrical connections.

The lead connection surface 2104 can be formed as staggered rows connected to a dambar 2108 at each side of a perimeter or outer extent of the leads 2102. For example, the leads 2102, such as a signal lead, can form a column of the lead connection surface 2104 disposed at one side of a leadframe 2110 staggered or interlaced with another column of the lead connection surface 2104 disposed along an opposite side of the leadframe 2110.

The dambar 2108 can provide structural integrity and substantially fixed positions for the leads 2102 during processing. The dambar 2108 can be removed by removal processes such as sawing or etching. A portion of the dambar 2108 can optionally be connected to the leads 2102 resulting from some removal processes.

Figure 22:
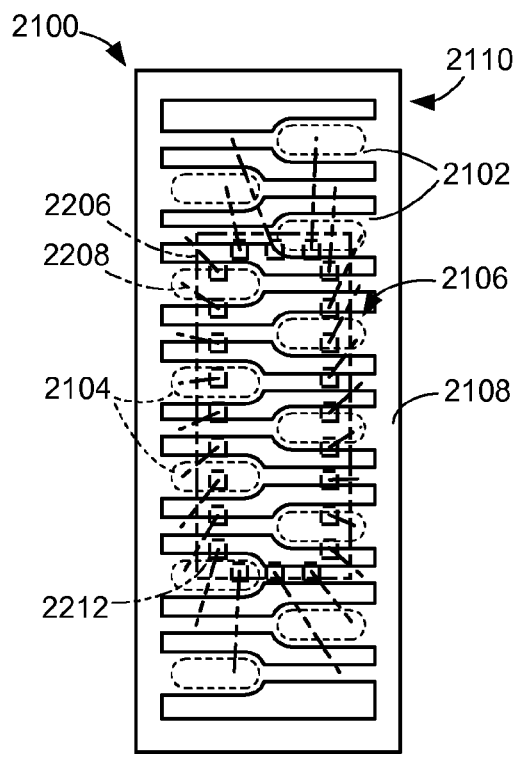
FIG. 22 is the structure of FIG. 21 in an attach phase.

Referring now to FIG. 22, therein is shown the structure of FIG. 21 in an attach phase. The integrated circuit package system 2100 preferably includes the leads 2102 with an integrated circuit 2206 thereover. Die connectors 2208 can electrically connect die pads 2212 of the integrated circuit 2206 and the leads 2102 of the leadframe 2110.

The die connectors 2208 can connect the integrated circuit 2206 to the leads 2102 having the lead connection surface 2104 substantially within a region below a perimeter of the integrated circuit 2206 as well as adjacent locations of the leads 2102.

The lead connection surface 2104 can be substantially exposed on a side of the leads 2102 opposite the integrated circuit 2206 for connectivity to a next level system such as another package or a printed circuit board.

The integrated circuit 2206 can be attached or mounted over the leads 2102 without the need for a die paddle, a perimeter lead, a substrate conductor, or a redistribution layer. The leads 2102 can provide die support in a manner similar to a die attach pad without the need for die attach pads. A portion of the leads 2102 can include the lead connection surface 2104 substantially within the region below the perimeter of the integrated circuit 2206.

Figure 23:
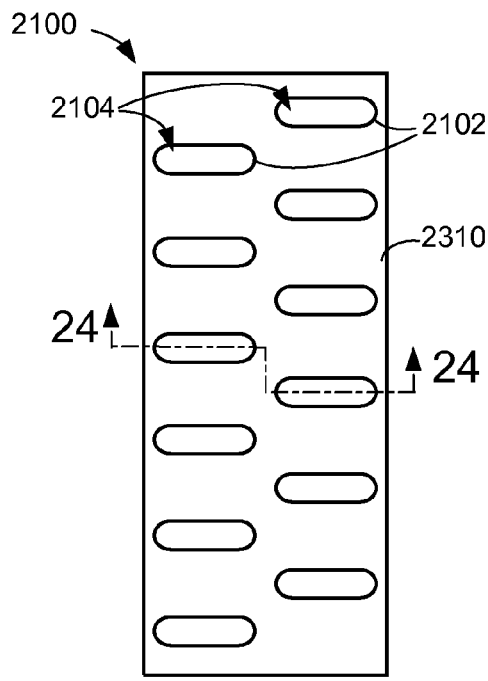
FIG. 23 is a bottom view of the integrated circuit package system.

Referring now to FIG. 23, therein is shown a bottom view of the integrated circuit package system 2100. The integrated circuit package system 2100 preferably includes the leads 2102 having the lead connection surface 2104 and an encapsulant 2310.

The encapsulant 2310 can cover or protect the leads 2102, the integrated circuit 2206 of FIG. 22, or the die connectors 2208 of FIG. 22. Electrical isolation from the encapsulant 2310 can provide discrete electrical connectivity for each of the leads 2102.

For illustrative purposes, an array of the lead connection surface 2104 is shown having two staggered columns although it is understood than any number or configuration of the leads 2102 or the lead connection surface 2104 may be used.

Figure 24:
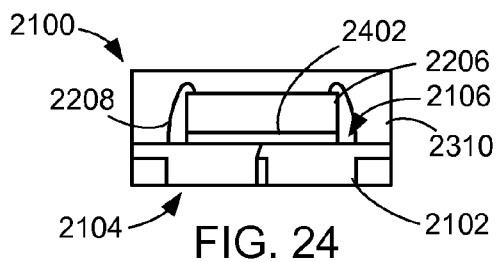
FIG. 24 is a cross-sectional view of the structure of FIG. 23.

Referring now to FIG. 24, therein is shown a cross-sectional view of the structure of FIG. 23. The integrated circuit package system 2100 preferably includes the die connectors 2208, the integrated circuit 2206, and the leads 2102.

The integrated circuit 2206 can be attached or mounted over the lead mounting surface 2106 of the leads 2102 without the need for a die paddle, a perimeter lead, a substrate conductor, or a redistribution layer. An attach layer 2402 can attach or mount the integrated circuit 2206 over the leads 2102 providing structural integrity or a substantially fixed location.

The encapsulant 2310 can cover or protect and be in direct contact with the die connectors 2208, the integrated circuit 2206, and a portion of the leads 2102 providing the lead connection surface 2104 substantially exposed or connectivity to a next level system. For example, one of the leads 2102, such as the signal lead, can be exposed at opposing sides of the encapsulant 2310 and at the lead connection surface 2104 at a third side of the encapsulant 2310.

The lead connection surface 2104 can be substantially exposed on a side of the leads 2102 opposite the integrated circuit 2206 for connectivity to a next level system such as another package or a printed circuit board.

Figure 25:
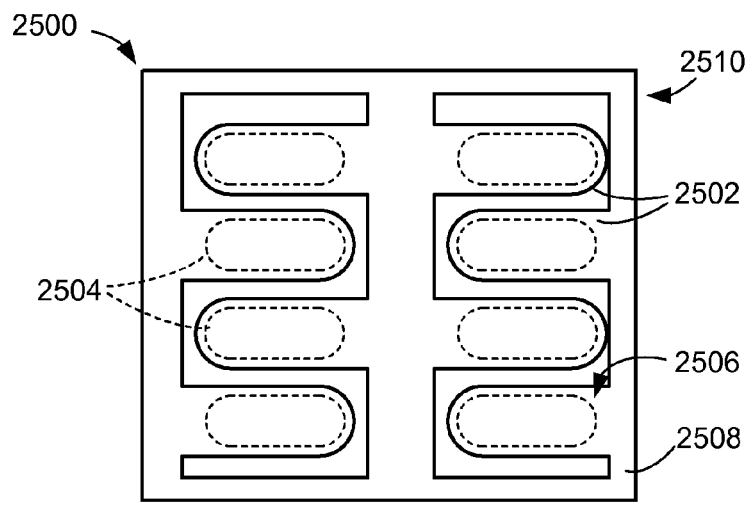
FIG. 25 is a top view of an integrated circuit package system in a formation phase of an eighth embodiment of the present invention.

Referring now to FIG. 25, therein is shown a top view of an integrated circuit package system 2500 in a formation phase of an eighth embodiment of the present invention. The integrated circuit package system 2500 preferably includes leads 2502 having a lead connection surface 2504 on a side opposite a lead mounting surface 2506.

Devices, connectors, or other components can be mounted over or attached to the lead mounting surface 2506. For example, the lead mounting surface 2506 can be substantially covered by devices, connectors, or other components resulting in significantly reduced regions for electrical connections.

The leads 2502 can be formed as separate structures connected by a dambar 2508 around a perimeter or at outer extents of the leads 2502. For example, a leadframe 2510 can be formed having two staggered sets of the leads 2502 having spacing around sides of the leads 2502 except at an outer edge connected to the dambar 2508.

The dambar 2508 can provide structural integrity and substantially fixed positions for the leads 2502 during processing. The dambar 2508 can be removed by removal processes such as sawing or etching. A portion of the dambar 2508 can optionally be connected to the leads 2502 resulting from some removal processes.

Figure 26:
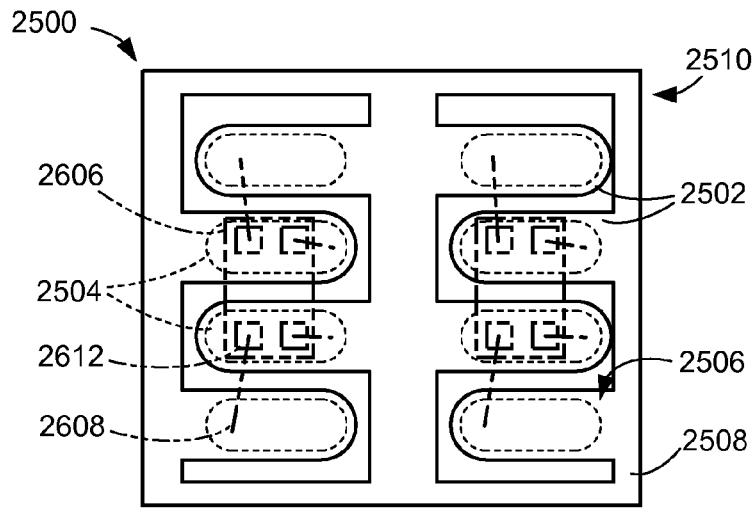
FIG. 26 is the structure of FIG. 25 in an attach phase.

Referring now to FIG. 26, therein is shown the structure of FIG. 25 in an attach phase. The integrated circuit package system 2500 preferably includes the leads 2502 with an integrated circuit 2606 thereover without the need for a die paddle, a perimeter lead, a substrate conductor, or a redistribution layer. Die connectors 2608 can electrically connect die pads 2612 of the integrated circuit 2606 and the leads 2502 of the leadframe 2510.

The die connectors 2608 can connect the integrated circuit 2606 to the leads 2502 having the lead connection surface 2504 substantially within a region below a perimeter of the integrated circuit 2606 as well as adjacent locations of the leads 2502. Further, more than one of the integrated circuit 2606 can be connected to any of the leads 2502.

The lead connection surface 2504 can be substantially exposed on a side of the leads 2502 opposite the integrated circuit 2606 for connectivity to a next level system such as another package or a printed circuit board.

For illustrative purposes the integrated circuit package system 2500 is shown with two of the integrated circuit 2606 attached or mounted over two of the leadframe 2510 although it is understood than any number of the integrated circuit 2606 or the leadframe 2510 may be used.

Figure 27:
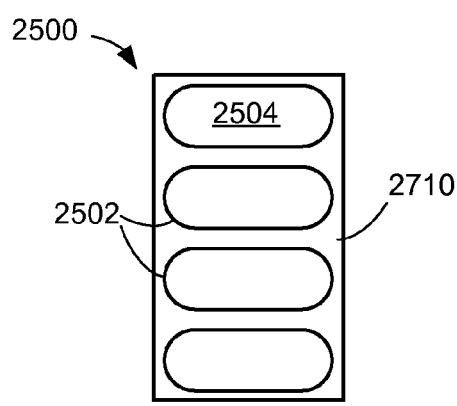
FIG. 27 is a bottom view of the integrated circuit package system.

Referring now to FIG. 27, therein is shown a bottom view of the integrated circuit package system 2500. The integrated circuit package system 2500 preferably includes the leads 2502 having the lead connection surface 2504 and an encapsulant 2710.

The encapsulant 2710 can cover or protect the leads 2502, the integrated circuit 2606 of FIG. 26, or the die connectors 2608 of FIG. 26. Electrical isolation from the encapsulant 2710 can provide discrete electrical connectivity for each of the leads 2502.

One of the integrated circuit 2606 with one set of the leads 2502 having the lead connection surface 2504 is shown providing an isolated or singulated package. Two or more sets of the leads 2502 and the integrated circuit 2606 can be formed during processing for improved manufacturing efficiency.

Figure 28:
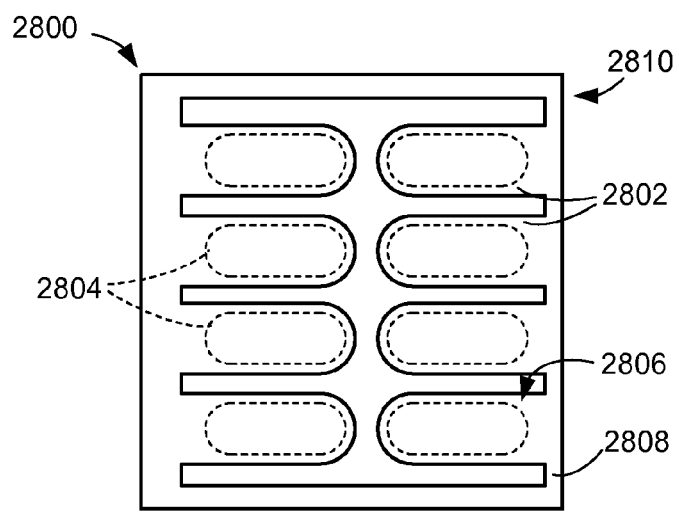
FIG. 28 is a top view of an integrated circuit package system in a formation phase of a ninth embodiment of the present invention.

Referring now to FIG. 28, therein is shown a top view of an integrated circuit package system 2800 in a formation phase of a ninth embodiment of the present invention. The integrated circuit package system 2800 preferably includes leads 2802 having a lead connection surface 2804 on a side opposite a lead mounting surface 2806.

Devices, connectors, or other components can be mounted over or attached to the lead mounting surface 2806. For example, the lead mounting surface 2806 can be substantially covered by devices, connectors, or other components resulting in significantly reduced regions for electrical connections.

The leads 2802 can be formed as separate structures connected by a dambar 2808 around a perimeter or at outer extents of the leads 2802. For example, a leadframe 2810 can be formed having spacing around sides of the leads 2802 except at an outer edge connected to the dambar 2808 resulting in improved removal for singulation.

The dambar 2808 can provide structural integrity and substantially fixed positions for the leads 2802 during processing. The dambar 2808 can be removed by removal processes such as sawing or etching. A portion of the dambar 2808 can optionally be connected to the leads 2802 resulting from some removal processes.

Figure 29:
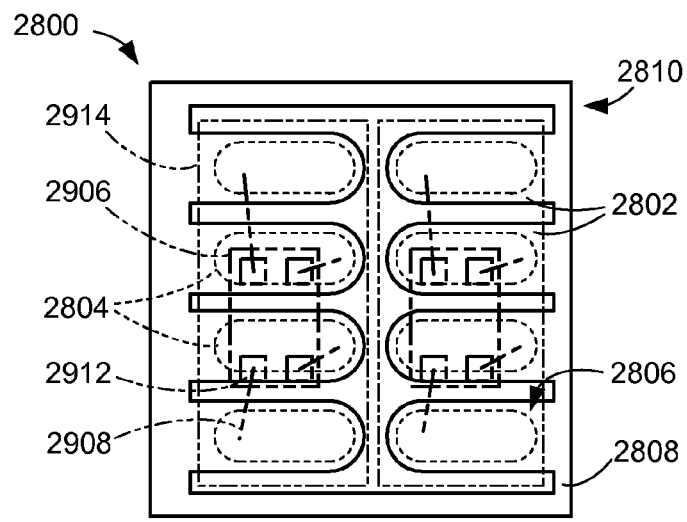
FIG. 29 is the structure of FIG. 28 in an attach phase.

Referring now to FIG. 29, therein is shown the structure of FIG. 28 in an attach phase. The integrated circuit package system 2800 preferably includes the leads 2802 with an integrated circuit 2906 thereover without the need for a die paddle, a perimeter lead, a substrate conductor, or a redistribution layer. Die connectors 2908 can electrically connect die pads 2912 of the integrated circuit 2906 and the leads 2802 of the leadframe 2810.

The die connectors 2908 can connect the integrated circuit 2906 to the leads 2802 having the lead connection surface 2804 substantially within a region below a perimeter of the integrated circuit 2906 as well as adjacent locations of the leads 2802. Further, more than one of the integrated circuit 2906 can be connected to any of the leads 2802.

The lead connection surface 2804 can be substantially exposed on a side of the leads 2802 opposite the integrated circuit 2906 for connectivity to a next level system such as another package or a printed circuit board.

For illustrative purposes the integrated circuit package system 2800 is shown with two sets of the integrated circuit 2906 attached or mounted over two sets of the leadframe 2810 separated by phantom lines depicting two of a package 2914 although it is understood than any number of the integrated circuit 2906 or the leadframe 2810 may be used.

Figure 30:
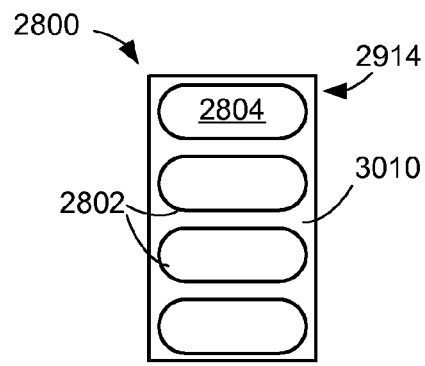
FIG. 30 is a bottom view of the integrated circuit package system.

Referring now to FIG. 30, therein is shown a bottom view of the integrated circuit package system 2800. The integrated circuit package system 2800 preferably includes the leads 2802 having the lead connection surface 2804 and an encapsulant 3010.

The encapsulant 3010 can cover or protect the leads 2802, the integrated circuit 2906 of FIG. 29, or the die connectors 2908 of FIG. 29. Electrical isolation from the encapsulant 3010 can provide discrete electrical connectivity for each of the leads 2802.

One of the integrated circuit 2906 with one set of the leads 2802 having the lead connection surface 2804 is shown providing the package 2914 isolated or singulated. Two or more sets of the leads 2802 and the integrated circuit 2906 can be formed during processing for improved manufacturing efficiency.

Figure 31:
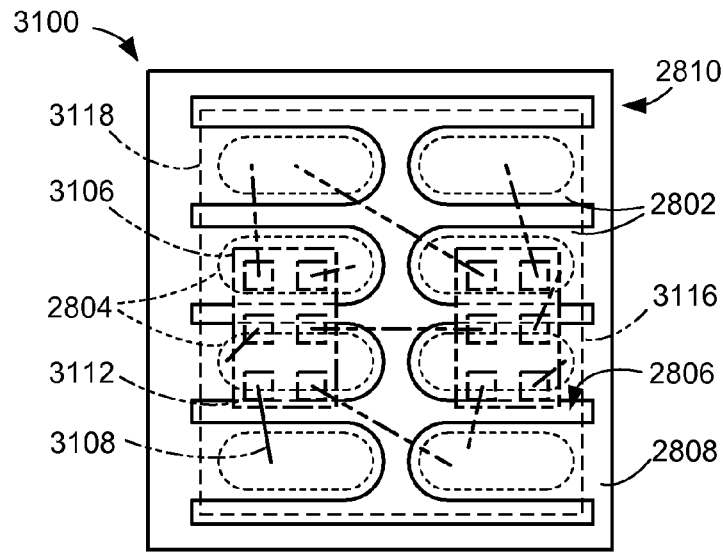
FIG. 31 is a top view of an integrated circuit package system in an attach phase of a tenth embodiment of the present invention.

Referring now to FIG. 31, therein is shown a top view of an integrated circuit package system 3100 in an attach phase of a tenth embodiment of the present invention. The integrated circuit package system 3100 preferably includes the leads 2802 with a first integrated circuit 3106 having die pads 3112 thereover without the need for a die paddle, a perimeter lead, a substrate conductor, or a redistribution layer. Die connectors 3108 can electrically connect the die pads 3112 of the first integrated circuit 3106 and the leads 2802 of the leadframe 2810.

The die connectors 3108 can connect the first integrated circuit 3106 or a second integrated circuit 3116 to the leads 2802 having the lead connection surface 2804 substantially within a region below a perimeter of the first integrated circuit 3106 as well as adjacent locations of the leads 2802. Further, more than one of the first integrated circuit 3106 or the second integrated circuit 3116 can be connected to any of the leads 2802.

The lead connection surface 2804 can be substantially exposed on a side of the leads 2802 opposite the first integrated circuit 3106 or the second integrated circuit 3116 for connectivity to a next level system such as another package or a printed circuit board.

For illustrative purposes the integrated circuit package system 3100 is shown with the first integrated circuit 3106 and the second integrated circuit 3116 attached or mounted over the leadframe 2810 surrounded by phantom lines for package outlines 3118 although it is understood than any number of the first integrated circuit 3106, the second integrated circuit 3116, or the leadframe 2810 may be used.

Figure 32:
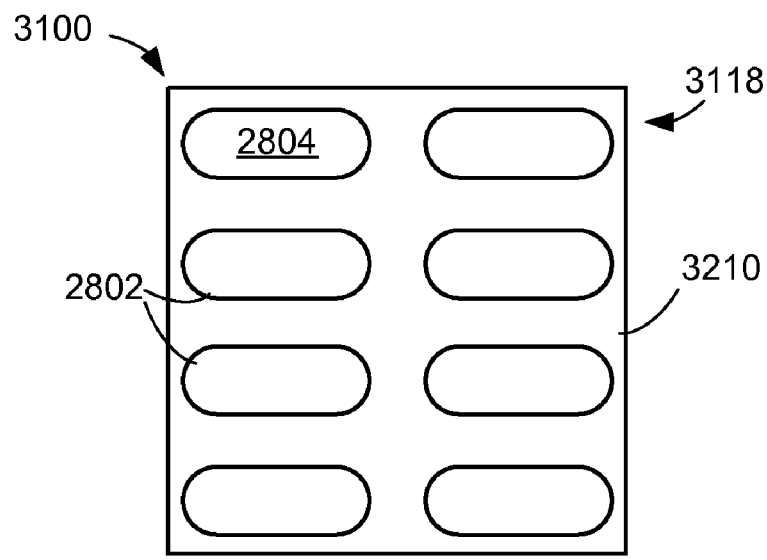
FIG. 32 is a bottom view of the integrated circuit package system.

Referring now to FIG. 32, therein is shown a bottom view of the integrated circuit package system 3100. The integrated circuit package system 3100 preferably includes the leads 2802 having the lead connection surface 2804 and an encapsulant 3210.

The encapsulant 3210 can cover or protect the leads 2802, the first integrated circuit 3106 of FIG. 31, or the die connectors 3108 of FIG. 31. Electrical isolation from the encapsulant 3210 can provide discrete electrical connectivity for each of the leads 2802.

One of the first integrated circuit 3106 and one of the second integrated circuit 3116 of FIG. 31 with a set of the leads 2802 having the lead connection surface 2804 can be within the package outlines 3118 of FIG. 31. Singulation or isolation near the package outlines 3118 can provide the integrated circuit package system 3100.

Figure 33:
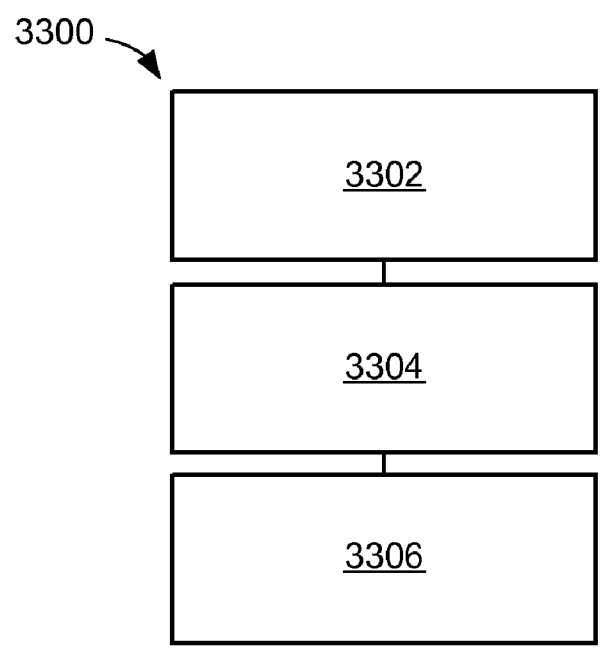
FIG. 33 is a flow chart of an integrated circuit package system for manufacturing the integrated circuit package system in an embodiment of the present invention.

Referring now to FIG. 33, therein is shown a flow chart of an integrated circuit package system 3300 for manufacturing the integrated circuit package system 100 in an embodiment of the present invention. The system 3300 includes providing a lead having a lead connection surface for connectivity to a next level system in a block 3302; attaching an integrated circuit over the lead having the lead connection surface substantially within a region below a perimeter of the integrated circuit without the need for a die paddle, a substrate conductor, or a redistribution layer in a block 3304; and attaching a die connector to the integrated circuit and the lead in a block 3306.

In greater detail, a system to provide the method and apparatus of the integrated circuit package system 100, in an embodiment of the present invention, is performed as follows:

1. Providing a lead having a lead connection surface for connectivity to a next level system on a side opposite a lead mounting surface for devices, connectors, or other components.
2. Attaching an integrated circuit over the lead mounting surface and having the lead connection surface substantially within a region below a perimeter of the integrated circuit without the need for a die paddle, a substrate conductor, or a redistribution layer.
3. Attaching a die connector to the integrated circuit and the lead mounting surface.

4. Applying an encapsulant over the die connector, the integrated circuit, and part of the lead.
5. Applying a package encapsulant over the pad connector, the base integrated circuit, the die connector, and a portion of the substrate pad.
6. Forming a package recess having a portion of the package encapsulant removed to form a recess edge and a portion of the pad connector removed to form a truncated surface.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing leads having a lead connection surface with the leads all parallel to each other for connecting to a next level system, the leads including a signal lead;
   attaching an integrated circuit over the leads having the lead connection surface substantially within a region below a perimeter of the integrated circuit without a die paddle, a substrate conductor, or a redistribution layer;
   attaching a die connector to the integrated circuit and the leads; and
   applying an encapsulant on the die connector, the integrated circuit, and part of the leads, the signal lead exposed from the encapsulant at opposing sides of the encapsulant and extending horizontally between the opposing sides.

2. The method as claimed in claim 1 wherein providing the leads includes forming a lead protrusion with the lead connection surface.

3. The method as claimed in claim 1 wherein providing the leads includes forming the leads in an array for more than one of a package outline.

4. The method as claimed in claim 1 wherein attaching the die connector includes attaching the die connector to the leads adjacent the integrated circuit.

5. The method as claimed in claim 1 further comprising attaching a second integrated circuit over the leads.

6. A method of manufacture of an integrated circuit package system comprising:
   providing leads having a lead connection surface with the leads all parallel to each other for connecting to a next level system on a side opposite a lead mounting surface for devices, connectors, or other components, the leads including a signal lead;
   attaching an integrated circuit over the lead mounting surface and having the lead connection surface substantially within a region below a perimeter of the integrated circuit without a die paddle, a substrate conductor, or a redistribution layer;
   attaching a die connector to the integrated circuit and the lead mounting surface; and
   applying an encapsulant on the die connector, the integrated circuit, and part of the leads, the signal lead exposed from the encapsulant at opposing sides of the of the encapsulant and extending horizontally between the opposing sides.

7. The method as claimed in claim 6 wherein providing the leads includes providing a plurality of the leads in a staggered array.

8. The method as claimed in claim 6 wherein providing the leads includes providing a plurality of the leads in an interlaced array.

9. The method as claimed in claim 6 further comprising attaching a second integrated circuit over the leads within a package outline.

10. The method as claimed in claim 6 further comprising forming an isolation channel for isolation of two or more adjacent of the lead connection surface.

11. An integrated circuit package system comprising:
    leads having a lead connection surface with the leads all parallel to each other for connecting to a next level system, the leads including a signal lead;
    an integrated circuit over the leads having the lead connection surface substantially within a region below a perimeter of the integrated circuit without a die paddle, a substrate conductor, or a redistribution layer; and
    a die connector attached to the integrated circuit and the leads; and
    an encapsulant on the die connector, the integrated circuit, and part of the leads, the signal lead exposed from the encapsulant at opposing sides of the encapsulant and extending horizontally between the opposing sides.

12. The system as claimed in claim 11 wherein each of the leads include a lead protrusion with the lead connection surface.

13. The system as claimed in claim 11 wherein the leads are in an array for more than one of a package outline.

14. The system as claimed in claim 11 wherein the die connector is attached to the leads adjacent the integrated circuit.

15. The system as claimed in claim 11 further comprising a second integrated circuit over the leads.

16. The system as claimed in claim 11 wherein:
    the leads have the lead connection surface with the leads all the same size and parallel to each other for connecting to a next level system on a side opposite a lead mounting surface for devices, connectors, or other components;
    the integrated circuit is over the lead mounting surface and having the lead connection surface substantially within a region below a perimeter of the integrated circuit without a die paddle, a substrate conductor, or a redistribution layer; and
    the die connector is attached to the integrated circuit and the lead mounting surface.

17. The system as claimed in claim 16 wherein the leads are in a staggered array.

18. The system as claimed in claim 16 wherein the leads are in an interlaced array.

19. The system as claimed in claim 16 further comprising a second integrated circuit over the leads within a package outline.

20. The system as claimed in claim 16 further comprising an isolation channel for isolation of two or more adjacent of the lead connection surface.

* * * * *

UNITED STATES PATENT AND TRADEMARK OFFICE
CERTIFICATE OF CORRECTION

Page 1 of 1

PATENT NO. : 8,269,324 B2
APPLICATION NO. : 12/172095
DATED : September 18, 2012
INVENTOR(S) : Trasporto et al.

It is certified that error appears in the above-identified patent and that said Letters Patent is hereby corrected as shown below:

In the Specification:

Column 2, line 48, delete "along line 12-12 of FIG. 1;" and insert therefor --along line 12-12 of FIG. 11;--

In the Claims:

Column 16, lines 5-6, claim 6, delete "of the of the encapsulant" and insert therefor --of the encapsulant--

Signed and Sealed this
Eighteenth Day of February, 2014

Michelle K. Lee
*Deputy Director of the United States Patent and Trademark Office*